US012469683B2

(12) United States Patent
Lianto et al.

(10) Patent No.: US 12,469,683 B2
(45) Date of Patent: Nov. 11, 2025

(54) WATER VAPOR PLASMA TO ENHANCE SURFACE HYDROPHILICITY

(71) Applicant: Applied Materials, Inc., Santa Clara, CA (US)

(72) Inventors: Prayudi Lianto, Singapore (SG); Yin Wei Lim, Singapore (SG); James S. Papanu, San Rafael, CA (US); Guan Huei See, Singapore (SG); Eric J. Bergman, Kalispell, MT (US); Nur Yasmeen Addina Mohamed Helmi Isik, Singapore (SG); Wei Ying Doreen Yong, Singapore (SG); Vicknesh Sahmuganathan, Singapore (SG); Yi Kun Kelvin Goh, Singapore (SG); John Leonard Sudijono, Singapore (SG); Arvind Sundarrajan, Singapore (SG)

(73) Assignee: Applied Materials Inc., Santa Clara, CA (US)

( * ) Notice: Subject to any disclaimer, the term of this patent is extended or adjusted under 35 U.S.C. 154(b) by 361 days.

(21) Appl. No.: 17/486,334

(22) Filed: Sep. 27, 2021

(65) Prior Publication Data
US 2023/0100863 A1 Mar. 30, 2023

(51) Int. Cl.
H01J 37/32 (2006.01)
H01L 21/306 (2006.01)

(52) U.S. Cl.
CPC .. H01J 37/32357 (2013.01); H01J 37/32422 (2013.01); H01J 37/32449 (2013.01); H01J 37/32816 (2013.01); H01L 21/306 (2013.01)

(58) Field of Classification Search
None
See application file for complete search history.

(56) References Cited

U.S. PATENT DOCUMENTS

| | | | |
|---|---|---|---|
| 5,849,639 A | 12/1998 | Molloy et al. | |
| 5,919,336 A * | 7/1999 | Kikuchi | H01J 37/32357 438/723 |
| 7,695,755 B2 | 4/2010 | Kobrin et al. | |
| 7,704,887 B2 | 4/2010 | Fu et al. | |
| 10,002,771 B1 | 6/2018 | Lianto et al. | |
| 10,418,242 B2 | 9/2019 | Muramatsu et al. | |
| 2003/0082924 A1 | 5/2003 | Andideh et al. | |
| 2005/0173057 A1 | 8/2005 | Suga et al. | |
| 2006/0032582 A1* | 2/2006 | Chen | H01L 24/83 257/E21.505 |
| 2007/0068558 A1* | 3/2007 | Papanu | G03F 1/82 134/29 |
| 2009/0275213 A1* | 11/2009 | Gotou | H01L 21/6708 134/198 |
| 2012/0285481 A1* | 11/2012 | Lee | C23C 16/0245 134/1.1 |
| 2014/0147602 A1 | 5/2014 | Rafailovich et al. | |
| 2014/0336758 A1 | 11/2014 | Gorne et al. | |
| 2016/0319092 A1 | 11/2016 | Paulussen et al. | |
| 2018/0247914 A1 | 8/2018 | Peng et al. | |
| 2019/0362965 A1* | 11/2019 | Wong | H01L 23/29 |
| 2022/0315721 A1 | 10/2022 | Hashiguchi et al. | |

FOREIGN PATENT DOCUMENTS

JP 2006278719 A * 10/2006

OTHER PUBLICATIONS

Machine translation: JP2006278719; Otsuka, T. (Year: 2006).*
PCT International Search Report and Written Opinion for PCT/US2022/074233 dated Nov. 18, 2022.
Xuehua Wang, and Kenneth J. Cheng, Effect of Glow-Discharge Plasma Treatment on Contact Angle and Micromorphology of Bamboo Green Surface, Forests 2020, 11, 1293, www.mdpi.com/journal/forests.

* cited by examiner

*Primary Examiner* — Natasha N Campbell
(74) *Attorney, Agent, or Firm* — Moser Taboada

(57) ABSTRACT

Methods and apparatus for processing a substrate are provided herein. For example, methods for enhancing surface hydrophilicity on a substrate comprise a) supplying, using a remote plasma source, water vapor plasma to a processing volume of a plasma processing chamber to treat a bonding surface of the substrate, b) supplying at least one of microwave power or RF power at a frequency from about 1 kHz to 10 GHz and a power from about 1 kW to 10 kW to the plasma processing chamber to maintain the water vapor plasma within the processing volume during operation, and c) continuing a) and b) until the bonding surface of the substrate has a hydrophilic contact angle of less than 10°.

16 Claims, 2 Drawing Sheets

WATER VAPOR PLASMA TO ENHANCE SURFACE HYDROPHILICITY

FIELD

Embodiments of the disclosure generally relate to methods and apparatuses for processing substrates. More particularly, embodiments of the disclosure relate to methods and apparatus that use water vapor plasma to enhance surface hydrophilicity for substrate-level packaging.

BACKGROUND

Back-end-of-line (BEOL) packaging processes are known. For example, BEOL packing processes, typically, use one or more bonding processes to bond substrates to each other. For example, some methods and apparatus use one or more gas chemistries (e.g., argon (Ar), nitrogen ($N_2$), and/or oxygen ($O_2$)) that can be supplied to an interior of a plasma chamber, and a capacitively coupled RF source can be used to form a capacitively coupled plasma, e.g., a dry and wet process to treat a surface of a substrate to facilitate bonding during the BEOL packaging process. Such processes, however, do not provide an adequate hydrophilic surface (e.g., contact angle less than 10°) which is needed to achieve a required bonding strength (e.g., greater than 1 $J/m^2$).

SUMMARY

Methods and apparatus for processing a substrate are provided herein. In some embodiments, methods for enhancing surface hydrophilicity on a substrate comprise a) supplying, using a remote plasma source, water vapor plasma to a processing volume of a plasma processing chamber to treat a bonding surface of the substrate, b) supplying at least one of microwave power or RF power at a frequency from about 1 kHz to 10 GHz and a power from about 1 kW to 10 kW to the plasma processing chamber to maintain the water vapor plasma within the processing volume during operation, and c) continuing a) and b) until the bonding surface of the substrate has a hydrophilic contact angle of less than 10°.

In accordance with at least some embodiments, a non-transitory computer readable storage medium has stored thereon instructions that when executed by a processor perform a method for enhancing surface hydrophilicity on a substrate comprising a) supplying, using a remote plasma source, water vapor plasma to a processing volume of a plasma processing chamber to treat a bonding surface of the substrate, b) supplying at least one of microwave power or RF power at a frequency from about 1 kHz to 10 GHz and a power from about 1 kW to 10 kW to the plasma processing chamber to maintain the water vapor plasma within the processing volume during operation, and c) continuing a) and b) until the bonding surface of the substrate has a hydrophilic contact angle of less than 10°.

In accordance with at least some embodiments, a system for enhancing surface hydrophilicity on a substrate comprises a remote plasma source connected to a plasma processing chamber for supplying water vapor plasma to a processing volume of the plasma processing chamber to treat a bonding surface of the substrate and at least one of a microwave power source or an RF power source connected to the processing volume and configured to provide microwave power or RF power at a frequency from about 1 kHz to 10 GHz and a power from about 1 kW to 10 kW to the plasma processing chamber to maintain the water vapor plasma within the processing volume during operation, wherein the remote plasma source and the at least one of the microwave power source or the RF power source are operable until the bonding surface of the substrate has a hydrophilic contact angle of less than 10°.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
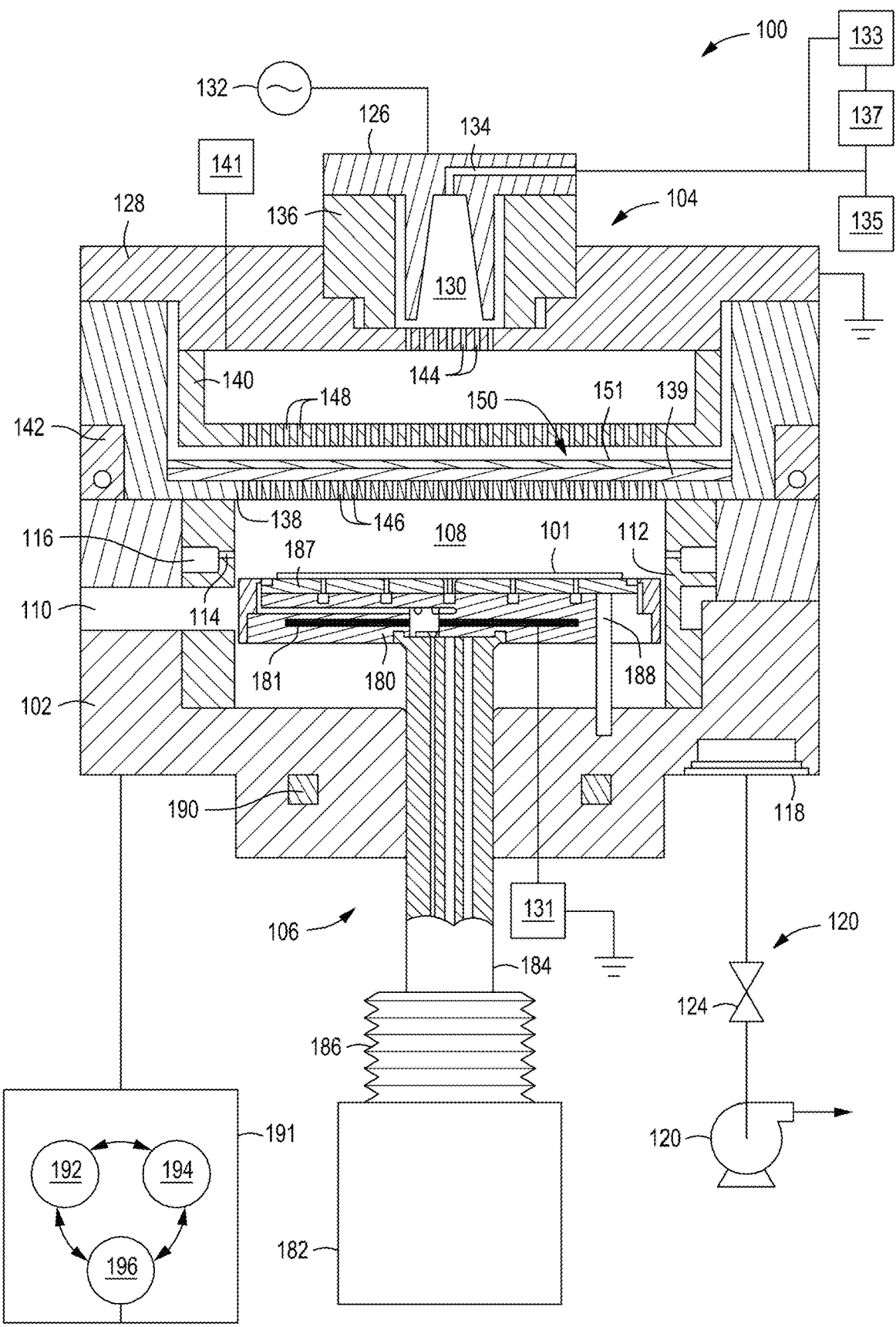
FIG. 1 is a partial cross-sectional view of a vacuum processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of processing a substrate are provided herein. For example, methods and apparatus can comprise a plasma system that is configured to provide water vapor gas chemistry (water vapor plasma), which can be combined with other gases (e.g., argon (Ar), nitrogen ($N_2$), oxygen ($O_2$) and/or ozone ($O_3$)). For example, the plasma system can comprise a remote plasma source that is configured to provide the water vapor plasma, and an RF generator and/or a microwave generator that is configured to supply at least one of microwave power or RF power at a frequency from about 1 kHz to 10 GHz and a power from about 1 kW to 10 kW to the plasma processing chamber to maintain the water vapor plasma within the processing volume during operation, e.g., until the bonding surface of the substrate has a hydrophilic contact angle of less than 10°. In accordance with the present disclosure, the water vapor plasma offers dual benefits of increasing surface hydrophilicity and concurrently cleaning the surface from organic contaminants. The dual benefits come without the need to compromise dielectric thickness loss, which, for example, can affect bonding copper (Cu) pad dish performance. Moreover, the microwave plasma, when used, offers higher plasma density, which can ensure completeness of surface treatment, and the remote plasma configuration produces gentle plasma which minimizes surface damage and/or roughening.

FIG. 1 is a schematic cross-sectional view of a processing chamber 100 for processing a substrate, in accordance with at least some embodiments of the present disclosure. The substrate may comprise various types such as, but not limited to, standard silicon wafers, diced wafers on tape frames, or bonded wafers. Examples of suitable processing chambers for incorporation of the apparatuses described herein include physical vapor deposition (PVD) chambers, chemical vapor deposition (CVD) deposition chambers, etching chambers, etc., all of which are available from Applied Materials, Inc., of Santa Clara, California. The following processing chamber description is provided for context and exemplary purposes and should not be interpreted or construed as limiting the scope of the disclosure. For illustrative purposes, the processing chamber 100 is described herein as a CVD chamber also capable of performing an etch process or cleaning process.

The processing chamber 100 includes a chamber body 102, a lid assembly 104, and a support assembly 106. The lid assembly 104 is positioned at an upper end of the chamber body 102. The support assembly 106 is disposed in an inner volume 108 (processing volume), defined by the chamber body 102. The chamber body 102 includes a slit valve opening 110 formed in a sidewall thereof. The slit valve opening 110 is selectively opened and closed to allow access to the inner volume 108 by a substrate handling robot (not shown) for substrate transfer.

The chamber body 102 may further include a liner 112 that surrounds the support assembly 106. The liner 112 may be made of a metal such as (Al), a ceramic material, or any other process compatible material. In one or more embodiments, the liner 112 includes one or more apertures 114 and a pumping channel 116 formed therein that is in fluid communication with a vacuum port 118. The apertures 114 provide a flow path for gases into the pumping channel 116. The pumping channel 116 provides an egress for the gases within the processing chamber 100 to the vacuum port 118.

A pressure system 120 can be configured to maintain a desired pressure (e.g., 1 mTorr to about 1 Torr) inside the processing chamber 100 and configured to exhaust (e.g., pumping down) the inner volume 108 of the processing chamber 100. For example, in at least some embodiments, the vacuum port 118 can be coupled to a pump 122 via a valve 124 for exhausting the inner volume 108 of the processing chamber 100 and maintaining a desired pressure inside the processing chamber 100, e.g., maintaining a relatively high pressure during a cleaning process and a relatively low pressure (e.g., vacuum) during substrate processing, or vice versa.

The lid assembly 104 includes at least two stacked components configured to form a plasma volume or cavity therebetween. In one or more embodiments, the lid assembly 104 includes a first electrode ("upper electrode") 126 disposed vertically above a second electrode ("lower electrode") 128. The first electrode 126 and the second electrode 128 confine a plasma cavity 130, therebetween. The first electrode 126 is coupled to a power source, such as an RF power source 132. The second electrode 128 is connected to ground, forming a capacitor between the first electrode 126 and second electrode 128 (e.g., capacitively coupled plasma (CCP)). The first electrode 126 is in fluid communication with a gas inlet 134 that is connected to a gas supply 135, which provides process gas (e.g., argon (Ar), hydrogen ($H_2$), nitrogen ($N_2$), oxygen ($O_2$) or ozone($O_3$)), which can be energized to create an active process gas (e.g., ionized plasma or radicals), to the processing chamber 100 via the gas inlet 134 for performing one or more processes (e.g., deposition process, etch process, cleaning process, etc.). The first end of the one or more gas inlets 134 opens into the plasma cavity 130.

Alternatively or additionally, the processing chamber 100 can comprise one or more coils (e.g., an inductively coupled plasma (ICP) configuration) that can be used to energize the one or more process gases to create an active process gas.

Alternatively or additionally, a microwave power source 141 can be connected to the processing chamber 100 and used to energize the one or more process gases to create an active process gas, as described in greater detail below.

Alternatively or additionally, the gas supply 135 can be coupled to a remote plasma source 137 that is configured to supply the plasma or radicals, depending on the configuration of the remote plasma source, to the plasma cavity 130 of the processing chamber 100. For example, in at least some embodiments, the remote plasma source 137 can be connected to a water supply 133 and be configured to provide water vapor plasma to a processing volume (e.g., the inner volume 108) to treat a bonding surface (not shown) of a substrate (e.g., the substrate 101). In at least some embodiments, the water supply 133 can be configured to provide water (e.g., deionized water) during processing, as described in greater detail below.

The lid assembly 104 may also include an isolator ring 136 that electrically isolates the first electrode 126 from the second electrode 128. The isolator ring 136 may be made from aluminum oxide (AlO) or any other insulative, processing compatible, material.

The lid assembly 104 may also include showerhead 150 and, optionally, a blocker plate 140. The showerhead 150 includes a gas distribution plate 138, a backing (gas) plate 139, and a chill plate 151. The second electrode 128, the gas distribution plate 138, the chill plate 151, and the blocker plate 140 may be stacked and disposed on a lid rim 142, which is coupled to the chamber body 102 and can function as a temperature-control ring, as described in more detail below.

The chill plate 151 is configured to regulate a temperature of the gas distribution plate 138 during processing. For example, the chill plate 151 may include one or more temperature control channels (not shown) formed therethrough such that a temperature control fluid may be provided therein to regulate the temperature of the gas distribution plate 138.

The second electrode 128 may include a plurality of gas passages 144 formed beneath the plasma cavity 130 to allow gas from the plasma cavity 130 to flow therethrough. The backing gas plate 139 may include one of more gas passages (not shown) and one or more gas delivery channels (not shown), thus allowing gas to flow from the one or more gas passages and into the processing region. Similarly, the gas distribution plate 138 includes a plurality of apertures 146 configured to distribute the flow of gases therethrough. The blocker plate 140 may optionally be disposed between the second electrode 128 and the gas distribution plate 138. The blocker plate 140 includes a plurality of apertures 148 to provide a plurality of gas passages from the second electrode 128 to the gas distribution plate 138.

The support assembly 106 may include a support member 180 (e.g., a substrate support). The support member 180 is configured to support a substrate 101 (e.g., an epoxy substrate, a glass substrate, a silicon substrate, diced substrate on tape frame, or bonded substrate) for processing. The support member 180 may be coupled to a lift mechanism 182 through a shaft 184, which extends through a bottom surface of the chamber body 102. The lift mechanism 182 may be flexibly sealed to the chamber body 102 by a bellows 186 that prevents vacuum leakage from around the shaft 184. The lift mechanism 182 allows the support member 180 to be moved vertically within the chamber body 102 between a lower transfer portion and a number of raised process positions. For example, in at least some embodiments, the lift mechanism 182 is configured to position a substrate support surface 187 of the support member 180 from a substrate processing position a first distance away from the showerhead 150 to, for example, a cleaning position a second distance away from the showerhead 150, wherein the second distance is less than the first distance. Additionally, one or more lift pins 188 may be disposed through the support member 180 and coupled to a bottom surface of the substrate support surface 187. The one or more lift pins 188 are configured to extend through the support member 180 such that the substrate 101 may be raised off the surface of the support member 180. The one or more lift pins 188 may be active by a lift ring 190.

A heater 181 (e.g., one or more heating electrodes) can be provided in the support assembly 106 and can be configured to heat the support assembly 106 (e.g., to heat the substrate 101 during processing thereof and/or during a cleaning process of the showerhead 150). The heater 181 is coupled to a DC power source 131 to heat the support assembly 106 to a predetermined temperature, e.g., to heat the substrate 101 and/or the showerhead 150.

The processing chamber may also include a controller 191. The controller 191 includes a central processing unit 192 (programmable) that is operable with a memory 194 and a mass storage device, an input control unit, and a display unit (not shown), such as power supplies, clocks, cache, input/output (I/O) circuits, and the liner 112, coupled to the various components of the processing system to facilitate control of the substrate processing.

To facilitate control of the processing chamber 100 described above, the central processing unit 192 may be one of any form of general-purpose computer processor that can be used in an industrial setting, such as a programmable logic controller (PLC), for controlling various chambers and sub-processors. The memory 194 is coupled to the central processing unit 192 and the memory 194 can be non-transitory computer readable storage medium and may be one or more of readily available memory such as random access memory (RAM), read only memory (ROM), floppy disk drive, hard disk, or any other form of digital storage, local or remote. Support circuits 196 are coupled to the central processing unit 192 for supporting the processor in a conventional manner. Charged species generation, heating, and other processes are generally stored in the memory 194, typically as software routine. The software routine may also be stored and/or executed by a second central processing unit (not shown) that is remotely located from the processing chamber 100 being controlled by the central processing unit 192.

The memory 194 is in the form of computer-readable storage media that contains instructions, that when executed by the central processing unit 192, facilitates the operation of the processing chamber 100. The instructions in the memory 194 are in the form of a program product such as a program that implements the method of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

Figure 2:
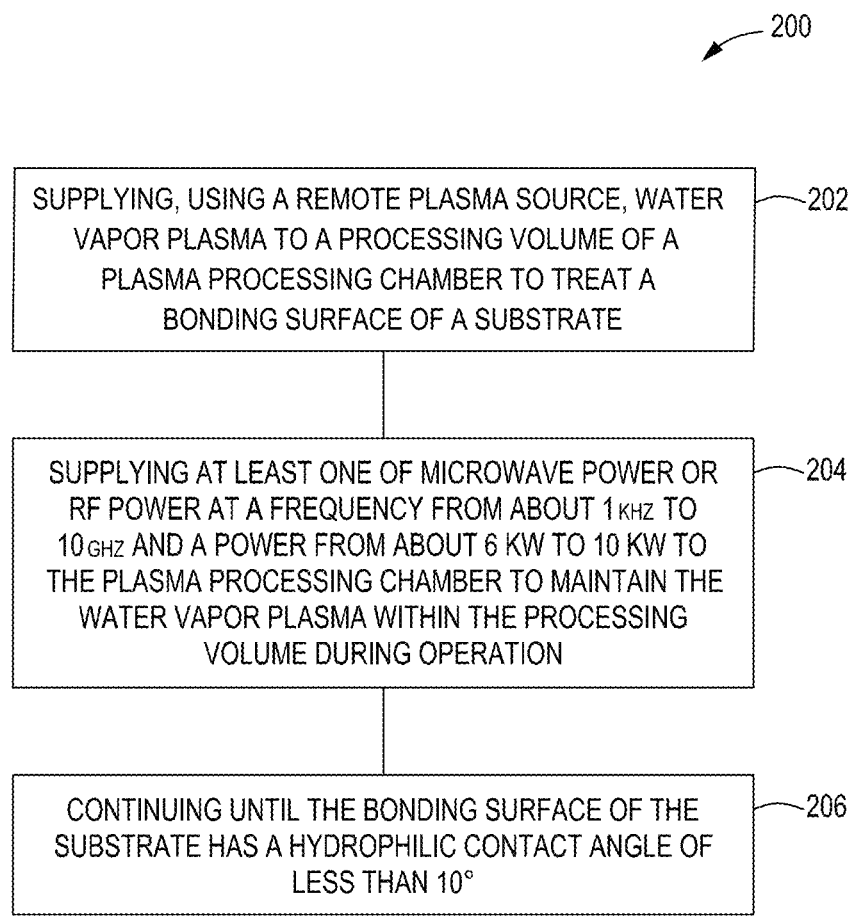
FIG. 2 is a flowchart of a method of processing a substrate using the vacuum processing apparatus of FIG. 1, in accordance with at least some embodiments of the present disclosure.

FIG. 2 is a flowchart of a method 200 of processing a substrate (e.g., the substrate 101, which can be an epoxy substrate, glass substrate, silicon substrate, diced substrate on tape frame, or bonded substrate) using the processing chamber 100 of FIG. 1, in accordance with at least some embodiments of the present disclosure. For example, after the substrate has been processed (e.g., a deposition process), the substrate may need to be prepared (cleaned/etched) for substrate packaging (e.g., a bonding process). As noted above, to facilitate achieving high bonding strength, a bonding surface of the substrate needs to be hydrophilic and clean (e.g., to remove organic/inorganic contaminants etc.).

Accordingly, the method 200 can be used for enhancing surface hydrophilicity on a substrate. For example, at 202, the method 200 comprises supplying, using a remote plasma source, water vapor plasma to a processing volume of a plasma processing chamber to treat a bonding surface of a substrate. For example, at 202, the remote plasma source 137 can supply water vapor plasma to the inner volume 108 of the processing chamber 100.

Next, at 204, the method 200 comprises supplying at least one of microwave power or RF power at a frequency from about 1 kHz to 10 GHz and a power from about 1 kW to 10 kW to the plasma processing chamber to maintain the water vapor plasma within the processing volume during operation. For example, the RF power source 132 can be used to maintain the water vapor plasma in the processing chamber 100. In at least some embodiments, the RF power can be supplied at a frequency of about 1 kHz to 10 MHz. Alternatively or additionally, the microwave power source 141 can be used to maintain the water vapor plasma in the processing chamber 100. In at least some embodiments, the microwave power can be supplied at a frequency of about 1 GHz to about 10 GHz. In at least some embodiments, the microwave power and/or the RF power can be supplied using a pulsed wave or a continuous wave. Moreover, in at least some embodiments, the inventors have found that a suitable plasma source-to-substrate distance can be about 2 cm to about 15 cm. Additionally, in at least some embodiments, a pressure within the processing volume can be about 1 mTorr to about 1 Torr.

Next, at 206, the method comprises continuing 202 and 204 until the bonding surface of the substrate has a hydrophilic contact angle of less than 10°. For example, in at least some embodiments, the substrate can be treated for about 0.1 seconds to about 30 minutes. For example, in at least some embodiments, the substrate can be treated for about 0.1 seconds to about 10 minutes.

In at least some embodiments, the method 200 optionally comprises supplying at least one of argon (Ar), hydrogen ($H_2$), nitrogen ($N_2$), oxygen ($O_2$) or ozone($O_3$) to the processing volume while supplying the water vapor plasma. In such embodiments, the at least one of argon (Ar), hydrogen ($H_2$), nitrogen ($N_2$), oxygen ($O_2$) can be supplied at a flow rate up to about 5000 sccm and the ozone ($O_3$) can be supplied at a flow rate up to about 10 slpm and has a concentration of about 0 to about 300 g/m$^3$.

In at least some embodiments, when using the ozone ($O_3$) it may prove advantageous to supply the ozone ($O_3$) at the above-described flow rate and concentration and treat the bonding surface of the substrate for about 0.1 seconds to about 30 minutes. Additionally, when using the ozone ($O_3$) to treat the bonding surface of the substrate, the method 200 comprises supplying deionized water before, after, or simultaneously with the ozone ($O_3$) to the inner volume 108 to coat the bonding surface of the substrate. In at least some embodiments, the method 200 comprises supplying the deionized water at a flow rate of about 0.1 ml/min to about 100 ml/min. Additionally, in at least some embodiments, the method 200 comprises supplying the deionized water at a temperature of about 0° C. to about 100° C. Moreover, in at least some embodiments, the method 200 comprises spinning the substrate at a speed above 0 rpms to about 150 rpms.

In at least some embodiments, when using the ozone ($O_3$), it may prove advantageous to treat the bonding surface of the substrate without using the water vapor plasma and the RF power source or the microwave source (e.g., a vacuum-based plasma environment is not needed).

In at least some embodiments, the deionized water can be used and the substrate can be spun during any of 202-206, as described above, with or without supplying any of the aforementioned process gases.

While the foregoing is directed to embodiments of the present disclosure, other and further embodiments of the disclosure may be devised without departing from the basic scope thereof.

The invention claimed is:

1. A method for enhancing surface hydrophilicity on a substrate, comprising:
    a) supplying, using a remote plasma source, water vapor plasma to a processing volume of a plasma processing chamber to treat a bonding surface of the substrate;
    b) supplying at least one of microwave power or RF power at a frequency from about 1 kHz to 10 GHz and a power from about 1 kW to 10 kW, supplying ozone ($O_3$) for about 0.1 seconds to about 30 minutes and at least one of argon (Ar), hydrogen ($H_2$), nitrogen ($N_2$), or oxygen ($O_2$) to the plasma processing chamber to maintain the water vapor plasma within the processing volume during operation; and
    c) continuing a) and b) until the bonding surface of the substrate has a hydrophilic contact angle of less than 10°, wherein the at least one of argon (Ar), hydrogen ($H_2$), nitrogen ($N_2$), oxygen ($O_2$) is supplied at a flow rate up to 5000 sccm and the ozone ($O_3$) is supplied at a flow rate up to 10 slpm.

2. The method of claim 1, wherein the RF power is supplied at a frequency of about 1 kHz to about 10 MHz.

3. The method of claim 1, wherein the microwave power is supplied at a frequency of about 1 GHz to about 10 GHz.

4. The method of claim 1, wherein a pressure within the processing volume is about 1 m Torr to about 1 Torr.

5. The method of claim 1, wherein the substrate is treated for about 0.1 seconds to about 10 minutes.

6. The method of claim 1, wherein the at least one of microwave power or RF power is supplied using a pulsed wave.

7. The method of claim 1, wherein the at least one of microwave power or RF power is supplied using a continuous wave.

8. The method of claim 1, wherein the ozone ($O_3$) has a concentration of up to about 300 $g/m^3$.

9. The method of claim 1, further comprising supplying deionized water to a surface of the substrate at a flow rate of about 0.1 ml/min to about 500 ml/min.

10. The method of claim 9, further comprising supplying the deionized water at a temperature of about 0° C. to about 100° C.

11. The method of claim 10, further comprising spinning the substrate at a speed above 0 rpms to about 150 rpms.

12. A non-transitory computer readable storage medium having stored thereon instructions that when executed by a processor perform a method for enhancing surface hydrophilicity on a substrate, comprising:
    a) supplying, using a remote plasma source, water vapor plasma to a processing volume of a plasma processing chamber to treat a bonding surface of the substrate;
    b) supplying at least one of microwave power or RF power at a frequency from about 1 kHz to 10 GHz and a power from about 1 KW to 10 KW, supplying ozone ($O_3$) for about 0.1 seconds to about 30 minutes and at least one of argon (Ar), hydrogen ($H_2$), nitrogen ($N_2$), or oxygen ($O_2$) to the plasma processing chamber to maintain the water vapor plasma within the processing volume during operation; and
    c) continuing a) and b) until the bonding surface of the substrate has a hydrophilic contact angle of less than 10°, wherein the at least one of argon (Ar), hydrogen ($H_2$), nitrogen ($N_2$), oxygen ($O_2$) is supplied at a flow rate up to 5000 sccm and the ozone ($O_3$) is supplied at a flow rate up to 10 slpm.

13. The method of claim 12, wherein the RF power is supplied at a frequency of about 1 kHz to about 10 MHz, and wherein the microwave power is supplied at a frequency of about 1 GHz to about 10 GHz.

14. The method of claim 12, wherein a pressure within the processing volume is about 1 mTorr to about 1 Torr.

15. The method of claim 12, wherein the substrate is processed for about 0.1 seconds to about 10 minutes.

16. The method of claim 12, wherein the at least one of microwave power or RF power is supplied using a pulsed wave.

* * * * *